United States Patent
Choo et al.

(10) Patent No.: US 9,424,940 B1
(45) Date of Patent: Aug. 23, 2016

(54) NONVOLATILE MEMORY DEVICE AND METHOD OF ERASING THE SAME

(71) Applicants: Gyosoo Choo, Yongin-si (KR); Dongku Kang, Seongnam-si (KR); Sungwhan Seo, Hwaseong-si (KR); Moosung Kim, Yongin-si (KR)

(72) Inventors: Gyosoo Choo, Yongin-si (KR); Dongku Kang, Seongnam-si (KR); Sungwhan Seo, Hwaseong-si (KR); Moosung Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/987,178

(22) Filed: Jan. 4, 2016

(30) Foreign Application Priority Data

Jun. 10, 2015 (KR) .......................... 10-2015-0081808

(51) Int. Cl.
*G11C 16/14* (2006.01)
*G11C 16/08* (2006.01)
*G11C 16/04* (2006.01)

(52) U.S. Cl.
CPC ............ *G11C 16/14* (2013.01); *G11C 16/0483* (2013.01); *G11C 16/08* (2013.01)

(58) Field of Classification Search
None
See application file for complete search history.

(56) References Cited

U.S. PATENT DOCUMENTS

| | | | |
|---|---|---|---|
| 6,560,164 B2 | 5/2003 | Kawai et al. | |
| 7,679,133 B2 | 3/2010 | Son et al. | |
| 8,081,508 B2 | 12/2011 | Kim et al. | |
| 8,427,881 B2 | 4/2013 | Jang et al. | |
| 8,553,466 B2 | 10/2013 | Han et al. | |
| 8,559,235 B2 | 10/2013 | Yoon et al. | |
| 8,599,622 B2 | 12/2013 | Kim et al. | |
| 8,627,257 B2 | 1/2014 | Kim et al. | |
| 8,638,611 B2 | 1/2014 | Sim et al. | |
| 8,654,587 B2 | 2/2014 | Yoon et al. | |
| 2011/0216603 A1* | 9/2011 | Han ........................ | G11C 16/04 365/185.23 |
| 2011/0233648 A1 | 9/2011 | Seol et al. | |
| 2011/0286274 A1* | 11/2011 | Chang ................ | G11C 16/3418 365/185.17 |
| 2014/0281770 A1 | 9/2014 | Kim et al. | |

FOREIGN PATENT DOCUMENTS

| | | |
|---|---|---|
| JP | 2009-091492 A | 4/2009 |
| KR | 10-2000-0043892 A | 7/2000 |
| KR | 10-0461286 B1 | 12/2004 |
| KR | 10-1504339 B1 | 3/2015 |

* cited by examiner

*Primary Examiner* — James G Norman
(74) *Attorney, Agent, or Firm* — Harness, Dickey & Pierce, P.L.C.

(57) ABSTRACT

A nonvolatile memory device includes a substrate, a plurality of memory cells stacked in a direction perpendicular to the substrate, word lines connected to the memory cells, a ground select transistor between the memory cells and the substrate, a ground select transistor between the memory cells and the substrate, a ground select line connected to the ground select transistor, a bit line on the memory cells, and a string select transistor between the memory cells and the bit line. In an erase operation, the ground select line is floated at a time when a specific time passes after the erase voltage is provided to the substrate. And the ground select line is floated at different times depending on a temperature.

20 Claims, 14 Drawing Sheets

FIG. 10

|  | Erase Mode | Trim Mode |
|---|---|---|
| SW1 | ON | ON |
| SW2 | ON | OFF |
| SW3 | OFF | ON |

NONVOLATILE MEMORY DEVICE AND METHOD OF ERASING THE SAME

CROSS-REFERENCE TO RELATED APPLICATIONS

This U.S. non-provisional patent application claims priority under 35 U.S.C. §119 to Korean Patent Application No. 10-2015-0081808, filed on Jun. 10, 2015, the entire contents of which are hereby incorporated by reference.

BACKGROUND

The present disclosure relates to semiconductor memories, and more particularly, to a nonvolatile memory device and a method of erasing the same.

Semiconductor memory devices may be classified into volatile semiconductor memory devices and nonvolatile semiconductor memory devices. Volatile semiconductor memory devices have a high read/write speed but have a disadvantage of losing their stored data when their power supplies are interrupted. Nonvolatile semiconductor memory device retain their stored data even when their power supplies are interrupted. Thus, nonvolatile memory devices are used to remember contents that have to be preserved regardless of whether power supplies are supplied or not. In particular, since a flash memory has a high integration compared with an existing EEPROM, it is advantageous in an application of a large capacity auxiliary memory device.

Recently, to improve a degree of integration of a semiconductor memory device, a semiconductor memory device having a three-dimensional structure is being studied. The three-dimensional semiconductor memory device has a structural characteristic different from an existing two-dimensional semiconductor memory device. Due to a structural difference between the three-dimensional semiconductor memory device and the two-dimensional semiconductor memory device, various methods for driving a three-dimensional semiconductor memory device are being studied.

SUMMARY

Example embodiments of inventive concepts relate to a nonvolatile memory device. The nonvolatile memory device may include a memory cell array, an address decoder, a voltage generator, and a control logic. The memory cell array may include at least one bit line and a plurality of cell strings on a substrate. Each of the cell strings includes a plurality of memory cells stacked on each in a direction perpendicular to the substrate, a ground select transistor between the memory cells and the substrate, and a string select transistor on the memory cells between the memory cells and one of the at least one bit line. The address decoder is configured to provide an erase voltage to the substrate during an erase operation. The address decoder is configured to float a ground select line connected to the ground select transistor in at least one of the cell strings after a specific time passes after the address decoder provides the erase voltage to the substrate during the erase operation. The voltage generator is configured to generate the erase voltage. The voltage generator is configured to change the erase voltage based on a on a temperature using first temperature information and ground select line transition information based on a feedback voltage corresponding to the erase voltage and second temperature information. The control logic is configured to generate a ground select line control signal based on the ground select line transition information. The address decoder is configured to float the ground select line according to the ground select line control signal.

In example embodiments, the voltage generator may be configured to generate the erase voltage so that the erase voltage increases or decreases by an offset voltage according to the first temperature information.

In example embodiments, the voltage generator may be configured to generate a first level of the erase voltage at a first temperature and to generate a second level of the erase voltage at a second temperature. The second level of the erase voltage may be higher than the first level of the erase voltage if the first temperature is higher than the second temperature.

In example embodiments, the control logic may be configured to generate the ground select line control signal so that the address decoder floats the ground select line at a later time at the second temperature rather than the first temperature.

In example embodiments, the voltage generator may be configured to generate the feedback voltage corresponding to the erase voltage according to a voltage division of a plurality of resistors.

In example embodiments, the voltage generator may include a voltage generating circuit configured to generate the erase voltage and the feedback voltage, and a ground select line determining circuit configured to generate the ground select line transition information.

In example embodiments, the voltage generating circuit may include a regulator configured to receive an erase target voltage. The voltage generating circuit may be configured to compensate the erase target voltage according to the first temperature information. The regulator may be configured to generate a pump control signal based on comparing the compensated erase target voltage with the feedback voltage.

In example embodiments, the regulator may be configured to generate the pump control signal at a first level if the feedback voltage is smaller than the compensated erase target voltage. The regulator may be configured to generate the pump control signal at a second level if the feedback voltage is equal to or greater than the compensated erase target voltage.

In example embodiments, the voltage generating circuit may include a charge pump configured to generate the erase voltage according to the pump control signal.

In example embodiments, the ground select line transition determining circuit may include a regulator configured to receive a ground select line target voltage. The regulator may be configured to compensate the ground select line target voltage according to the second temperature information. The regulator may be configured to generate the ground select line transition information based on comparing the compensated ground select line target voltage with the feedback voltage.

In example embodiments, the regulator may be configured to generate the ground select line transition information at a first level if the feedback voltage is smaller than the compensated ground select line target voltage. The regulator may be configured to generate the ground select line transition information at a second level if the feedback voltage is equal to or greater than the compensated ground select line target voltage.

Example embodiments of inventive concepts relate to a nonvolatile memory device. The nonvolatile memory device may include a substrate, a plurality of memory cells stacked in a direction perpendicular to the substrate, word lines connected to the memory cells stacked, a ground select transistor between the memory cells and the substrate, a ground select line connected to the ground select transistor, a bit line on the memory cells, string select transistor between the memory cells and the bit line, and a string select line connected to the string select transistor. In an erase operation, the nonvolatile memory device is configured to provide an erase voltage to the substrate and the nonvolatile memory device is configured to float the ground select line at a time when a specific time passes after the erase voltage is provided to the substrate. The nonvolatile memory device is configured to float the ground select line at different times during the erase operation depending on a temperature.

In example embodiments, the nonvolatile memory device may be configured to control the erase voltage so that the erase voltage increases or decreases by an offset voltage according to a temperature based on first temperature information.

In example embodiments, the nonvolatile memory device may be configured to generate ground select line transition information based on a feedback voltage and second temperature information. The feedback voltage may correspond to the erase voltage compensated by the first temperature information. The nonvolatile memory device may be configured to float the ground select line at different times according to the temperature using the ground select line transition information.

In example embodiments, the nonvolatile memory device may be configured to generate a first level of the erase voltage at a first temperature, the nonvolatile memory device may be configured to generate a second level of the erase voltage at a second temperature, and the first temperature may be higher than the second temperature. The second level of the erase voltage may be greater than the first level of the erase voltage. The nonvolatile memory device may be configured to float the ground select line at a later time at the second temperature rather than at the first temperature.

Example embodiments of inventive concepts also relate to a method of erasing a nonvolatile memory device including a plurality of cell strings, the each string including a plurality of memory cells stacked in a direction perpendicular to a substrate, a ground select transistor being provided between the memory cells and the substrate, and a string select transistor being provided between the memory cells and a bit line. The method may include receiving first temperature information and an erase target voltage, compensating the erase target voltage based on the first temperature information, comparing the compensated erase target voltage with a feedback voltage corresponding to an erase voltage being provided to the substrate to generate a pump control signal, generating the erase voltage based on the pump control signal by a charge pump, receiving second temperature information and a ground select line target voltage, compensating the ground select line target voltage based on the second temperature information, and comparing the compensated ground select line target voltage with the feedback voltage to generate ground select line transition information. A floating time of a ground select line connected to the ground select transistor is determined according to the ground select line transition information.

According to example embodiments of inventive concepts, a memory cell array includes a plurality of cell strings on a substrate, each of the cell strings including a plurality of memory cells serially connected to each other between a ground select transistor and a string select transistor; a read and write circuit connected to the memory cell array through at least one bit line; an address decoder connected to the memory cell array through a string selection line; an address decoder connected to the memory cell array through a string selection line, word lines, and a ground selection line, the address decoder being configured to provide an erase voltage to the substrate beginning at a first time during an erase operation, the address decoder being configured to float the ground select line beginning at a second time during the erase operation, the second time being after the first time; and a voltage generator connected to the address decoder. The voltage generator is configured to adjust a time interval between the first time and the second time during the erase operation based on temperature information.

In example embodiments, each of the cell strings may be arranged so the string select transistor is on top of the ground select transistor and so the memory cells serially-connected to each other are stacked on top of each other between the ground select transistor and the string select transistor.

In example embodiments, the voltage generator may be configured to generate a first level of the erase voltage at a first temperature. The voltage generator may be configured to generate a second level of the erase voltage at a second temperature. The second level of the erase voltage may be higher than the first level of the erase voltage if the first temperature is higher than the second temperature.

In example embodiments, the voltage generator may be configured to generate a ground select line control signal based on the temperature information. The address decoder may be configured to float the ground select line according to the ground select line control signal. The address decoder may be configured to increase or decrease the time interval between the first time and the second time during the erase operation according the ground select line control signal.

In example embodiments, the nonvolatile memory device may further include a control logic connected to the voltage generating circuit. The voltage generator may include a voltage generating circuit connected to a ground selection line transition determining circuit. The voltage generating circuit may include a first regulator, a charge pump connected to regulator, and two resistors connected to the charge pump. The ground selection line transition determining circuit may include a second regulator. The first regulator may be configured to receive an erase target voltage, a feedback voltage, and first temperature information. The first regulator may be configured to adjust the erase target voltage into a compensated erase target voltage by increasing or decreasing the erase target voltage according to the first temperature information. The first regulator may be configured to generate a pump control signal based on comparing the feedback voltage to the compensated erase target voltage. The charge pump may be configured to control the erase voltage according to the pump control signal. The second regulator may be configured to receive a ground select line target voltage, the feedback voltage, and second temperature information. The second regulator may be configured to compensate the ground selection line target voltage based on comparing the feedback voltage to the ground selection line target voltage. The second regulator may be configured to generate ground selection line transition information from comparing the feedback voltage with the compensated ground selection line voltage. The control logic may be configured to generate a ground selection line control signal based on the ground selection line transition information. The address decoder may be configured to float the ground select line according to the ground selection line control signal.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings:

FIG. 10 is a drawing illustrating states of switches SW1~SW3 of FIG. 9 according to an operation mode.

DETAILED DESCRIPTION

Figure 1:
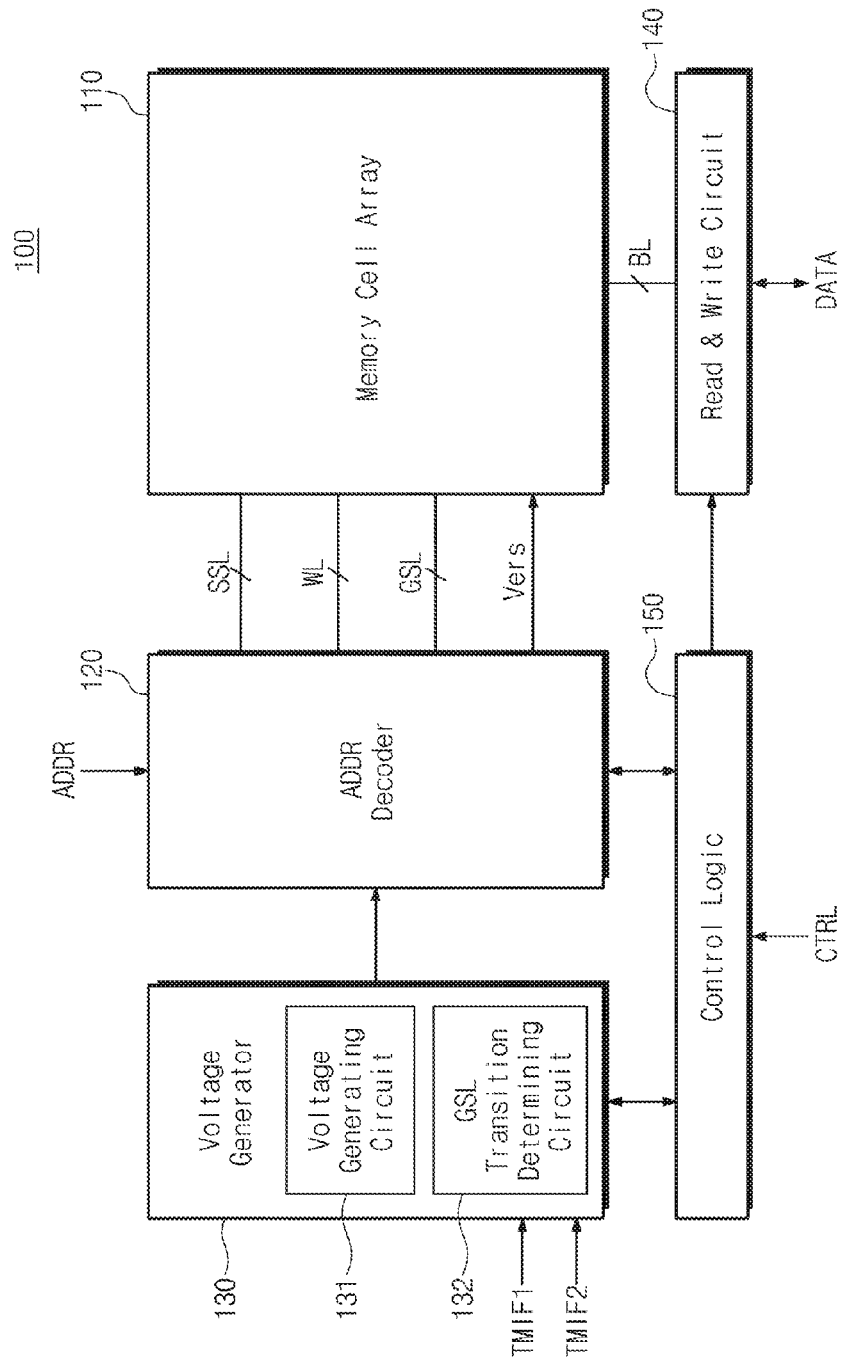
FIG. 1 is a block diagram illustrating a nonvolatile memory device in accordance with example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer. Each vertical NAND string may further include at least one select transistor located over memory cells. The at least one select transistor may have the same structure with the memory cells and may be formed monolithically together with the memory cells.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a nonvolatile memory device in accordance with example embodiments of inventive concepts. Referring to FIG. 1, a nonvolatile memory device 100 may include a memory cell array 110, an address decoder 120, a voltage generator 130, a read & write circuit 140, and a control logic 150. A physical characteristic of the nonvolatile memory device 100 may be different depending on a temperature. As a physical characteristic of the nonvolatile memory device 100 changes, a threshold voltage distribution of memory cells after an erase operation may also be changed. Thus, to improve a threshold voltage distribution of memory cells in an erase operation, a floating time of the ground selection line GSL may be changed depending on a temperature.

The memory cell array 110 may be connected to the address decoder 120 through string select lines SSL, word lines WL and ground select lines GSL, and may be connected to the read & write circuit 140 through bit lines BL. The memory cell array 110 may include a plurality of memory blocks. Memory cells of each memory block may form a two-dimensional structure. Memory cells of each memory block may also be stacked in a direction perpendicular to a substrate to form a three-dimensional structure. Each memory block may include a plurality of memory cells and a plurality of select transistors. Memory cells may be connected to word lines WL and select transistors may be connected to string select lines SSL or ground select lines GSL. Memory cells of each memory block can store one or more bits.

The address decoder 120 may be connected to the memory cell array 110 through string select lines SSL, word lines WL, and ground select lines GSL. The address decoder 120 may be configured to operate in response to a control of the control logic 150. The address decoder 120 can receive an address ADDR from a controller (not illustrated). For example, the controller can receive a command and an address ADDR from a host to control an overall operation of the nonvolatile memory device 100.

The address decoder 120 may be configured to decode a row address among received addresses ADDR. Using the decoded row address, the address decoder 120 can select string select lines SSL, word lines WL, and ground select lines GSL. The address decoder 120 may receive various voltages from the voltage generator 130 to deliver the received voltages to selected and unselected string select lines SSL, word lines WL, and ground select lines GSL respectively. For example, the address decoder 120 may deliver an erase voltage Vers generated by a voltage generating circuit 131 in an erase operation to the substrate of the memory cell array 110. The address decoder 120 may control a floating time of ground select lines GSL under the control of the control logic 150.

The address decoder 120 may be configured to decode a column address among the received addresses ADDR. The decoded column address may be transmitted to the read & write circuit 130. The address decoder 120 may include constituent elements such as a row decoder, a column decoder, an address buffer, etc.

The voltage generator 130 may be configured to generate various voltages used by the nonvolatile memory device 100. For example, the voltage generator 130 may generate a plurality of program voltages, a plurality of pass voltages, a plurality of select read voltages, and a plurality of unselect read voltages. Program voltages are applied to a word line selected in a program operation. Pass voltages are applied to a word line unselected in a program operation. Select read voltages are applied to a word line selected in a read operation. Unselect read voltages are applied to a word line unselected in a read operation.

The voltage generator 130 may include the voltage generating circuit 131 and a GSL transition determining circuit 132. The voltage generating circuit 131 can generate various voltages used by the nonvolatile memory device 100. For example, the voltage generating circuit 131 can generate an erase voltage Vers to be provided to the substrate in an erase operation. The voltage generating circuit 131 can generate an erase voltage Vers having different levels depending on a temperature (e.g., a temperature of a part of the memory cell array 110 such as a substrate). The voltage generating circuit 131 may generate an erase voltage Vers having different levels based on first temperature information TMIF1.

The GSL transition determining circuit 132 may receive a feedback voltage corresponding to the erase voltage Vers from the voltage generating circuit 131. The GSL transition determining circuit 132 may compare a feedback voltage with a desired (and/or alternatively predetermined) reference voltage to output GSL transition information illustrating a large and small relationship between the erase voltage Vers and the desired (and/or alternatively predetermined) reference voltage. The GSL transition determining circuit 132 may change the GSL transition information based on second temperature information TMIF2. The GSL transition information may be provided to the control logic 150 to determine a floating time of a ground select line GSL.

The read & write circuit 140 may be connected to the memory cell array 110 through bit lines BL and can change (and/or exchange) data with the controller. The read & write circuit 140 can operate in response to a control of the control logic 150.

The read & write circuit 140 can receive data DATA from the outside and write the received data DATA in the memory cell array 110. The read & write circuit 140 can read data DATA from the memory cell array 110 and transmit the read data DATA to the outside. The read & write circuit 140 can read data from a first storage area of the memory cell array 110 and write the read data in a second storage area of the memory cell array 140. For example, the read & write circuit 140 may be configured to perform a copy-back operation.

As an example, the read & write circuit 140 may include constituent elements such as a page buffer (or page register), a column select circuit, a data buffer, etc. As another example, the read & write circuit 140 may include constituent elements such as a sense amplifier, a write driver, a column select circuit, a data buffer, etc.

The control logic 150 may be connected to the address decoder 120, the voltage generator 130 and the read & write circuit 140. The control logic 150 may be configured to control an overall operation of the nonvolatile memory device 100. The control logic 150 may operate in response to a control signal CTRL being transmitted from the controller.

The control logic 150 may receive GSL transition information from the GSL transition determining circuit 132. The control logic 150 can generate a GSL control signal controlling a floating time of ground select line GSL in an erase operation in response to the GSL transition information. In an erase operation, the address decoder 120 can float ground select lines GSL according to the GSL control signal.

In an erase operation, the nonvolatile memory device 100 can control an erase voltage Vers being supplied to the substrate according to a temperature on the basis of the first temperature information TMIF1. Using a feedback voltage in which the first temperature information TMIF1 is reflected, the nonvolatile memory device 100 can control GSL transition information according to a temperature on the basis of the second temperature information TMIF2. Thus, the nonvolatile memory device 100 can control a floating time of ground select line GSL according to a temperature in an erase operation. A range and linearity of a floating time of a ground select line GSL may be improved in an erase operation by applying an offset with respect to a temperature twice. The first temperature information TMIF1 and second temperature information TMIF2 may correspond to temperature measurements at different times of a part of the nonvolatile memory device 100 such a substrate of the memory cell array 110.

Figure 2:
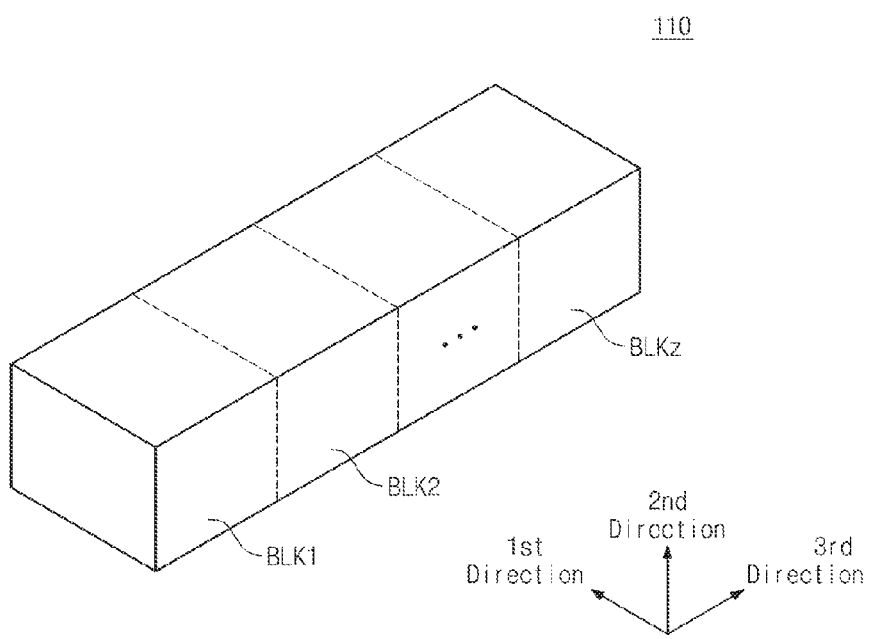
FIG. 2 is a block diagram illustrating a memory cell array of FIG. 1.

FIG. 2 is a block diagram illustrating a memory cell array of FIG. 1. Referring to FIG. 2, the memory cell array 110 may include a plurality of memory blocks BLK1~BLKz. Each memory block may have a three-dimensional structure. For example, each memory block may include structures extending along first through third directions. Each memory block may include a plurality of NAND strings NS extending along the second direction. A plurality of NAND strings NS may be provided along the first and third directions.

Each memory block may be connected to a plurality of bit lines BL, a plurality of string select lines SSL, a plurality of ground select lines GSL, a plurality of word lines WL, and a common source line CSL. Each NAND string NS may be connected to a bit line BL, a ground select line GSL, word lines WL and the common source line CSL.

The memory blocks BLK1~BLKz may be selected by the address decoder 120 illustrated in FIG. 1. For example, the address decoder 120 may be configured to select a memory block BLK corresponding to a decoded row address among the memory blocks BLK1~BLKz.

Figure 3:
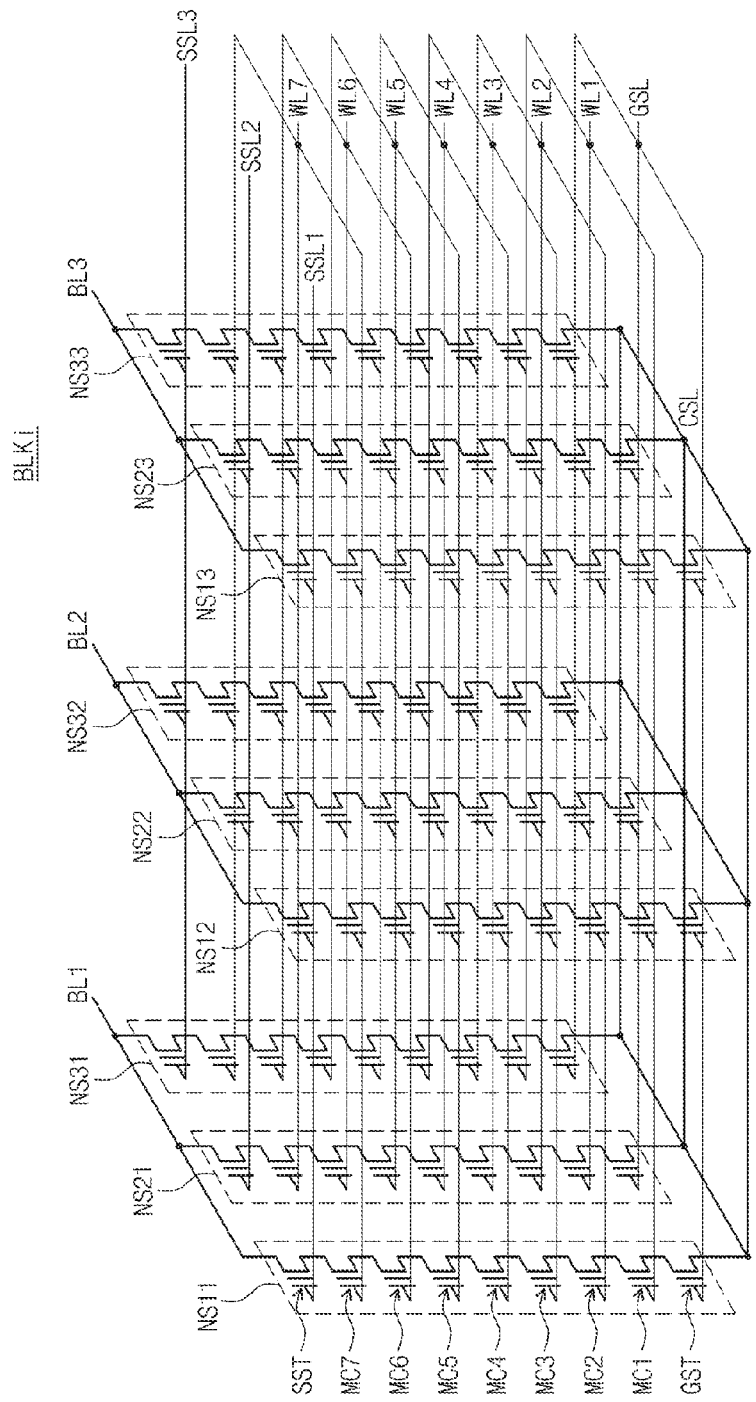
FIG. 3 is a circuit diagram illustrating one BLKi among memory blocks BLK1~BLKz of FIG. 2.

FIG. 3 is a circuit diagram illustrating one memory block BLKi among memory blocks BLK1~BLKz of FIG. 2. Referring to FIG. 3, NAND strings NS11, NS21 and NS31 may be provided between a first bit line BL1 and the common source line CSL. NAND strings NS12, NS22 and NS32 may be provided between a second bit line BL2 and the common source line CSL. NAND strings NS13, NS23 and NS33 may be provided between a third bit line BL3 and the common source line CSL.

Each NAND string NS may include a string select transistor SST, a ground select transistor GST, and a plurality of memory cells MC connected between the string select transistor SST and the ground select transistor GST. A string select transistor SST of each NAND string may be connected to a corresponding bit line BL. A ground select transistor GST of each NAND string may be connected to the common source line CSL.

NAND strings NS are defined by a row unit and a column unit. NAND strings NS connected to a bit line in common form a column. For example, the NAND strings NS11, NS21 and NS31 connected to the first bit line BL1 may correspond to a first column. The NAND strings NS12, NS22 and NS32 connected to the second bit line BL2 may correspond to a second column. The NAND strings NS13, NS23 and NS33 connected to the third bit line BL3 may correspond to a third column.

NAND strings NS connected to a string select line SSL form a row. For example, NAND strings NS11, NS12 and NS13 connected to a first string select line SSL1 form a first row. NAND strings NS21, NS22 and NS23 connected to a second string select line SSL2 form a second row. NAND strings NS31, NS32 and NS33 connected to a third string select line SSL3 form a third row.

In each NAND string NS, a height is defined. In each NAND string NS, a height of a memory cell MC1 adjacent to a ground select transistor GST is 1. In each NAND string NS, as a memory cell is located closer to a string select transistor SST, a height of the memory cell increases. In each NAND string NS, a height of a memory cell MC7 adjacent to a string select transistor SST is 7.

NAND strings NS of the same row share a string select line SSL. NAND strings NS of different rows are connected to different string select lines SSL. The NAND strings NS11~NS13, NS21~NS23 and NS31~NS33 share a ground select line GSL. Memory cells of the same height of NAND strings of the same row share a word line. In the same height, word lines WL of NAND strings NS of different rows are connected in common. The common source line CSL is connected to NAND strings NS in common.

As illustrated in FIG. 3, word lines WL of the same height are connected in common. Thus, when a specific word line WL is selected, all NAND strings NS connected to the specific word line WL may be selected. NAND strings NS of different rows are connected to different string select lines SSL. Thus, by selecting string select lines SSL1, SSL2 and SSL3, NAND strings NS of an unselected row among NAND strings NS connected to the same word line WL can be separated from the bit lines BL1, BL2 and BL3. That is, by selecting the string select lines SSL1, SSL2 and SSL3, a row of NAND strings NS may be selected. By selecting the bit lines BL1, BL2 and BL3, NAND strings NS of a selected row may be selected by a column unit.

One of ordinary skill in the art would appreciate that the circuit diagram of the memory block BLKi in FIG. 3 is a non-limiting example. The memory block may be modified in a various ways. For example, each NAND string may alternatively include more than seven or fewer than seven memory cells (e.g., MC1 to MC7) stacked on top of each other. Likewise, the number of word lines (e.g., WL1 to WL7) may be varied to correspond to the number of memory cells in each NAND string. Finally, each NAND string may also include a plurality of ground select transistors GST stacked on top of each other between the common source line CSL and the memory cells (e.g., MC1 to MC7) and/or a plurality of string select transistors (e.g., SST) stacked on top of each other.

Figure 4:
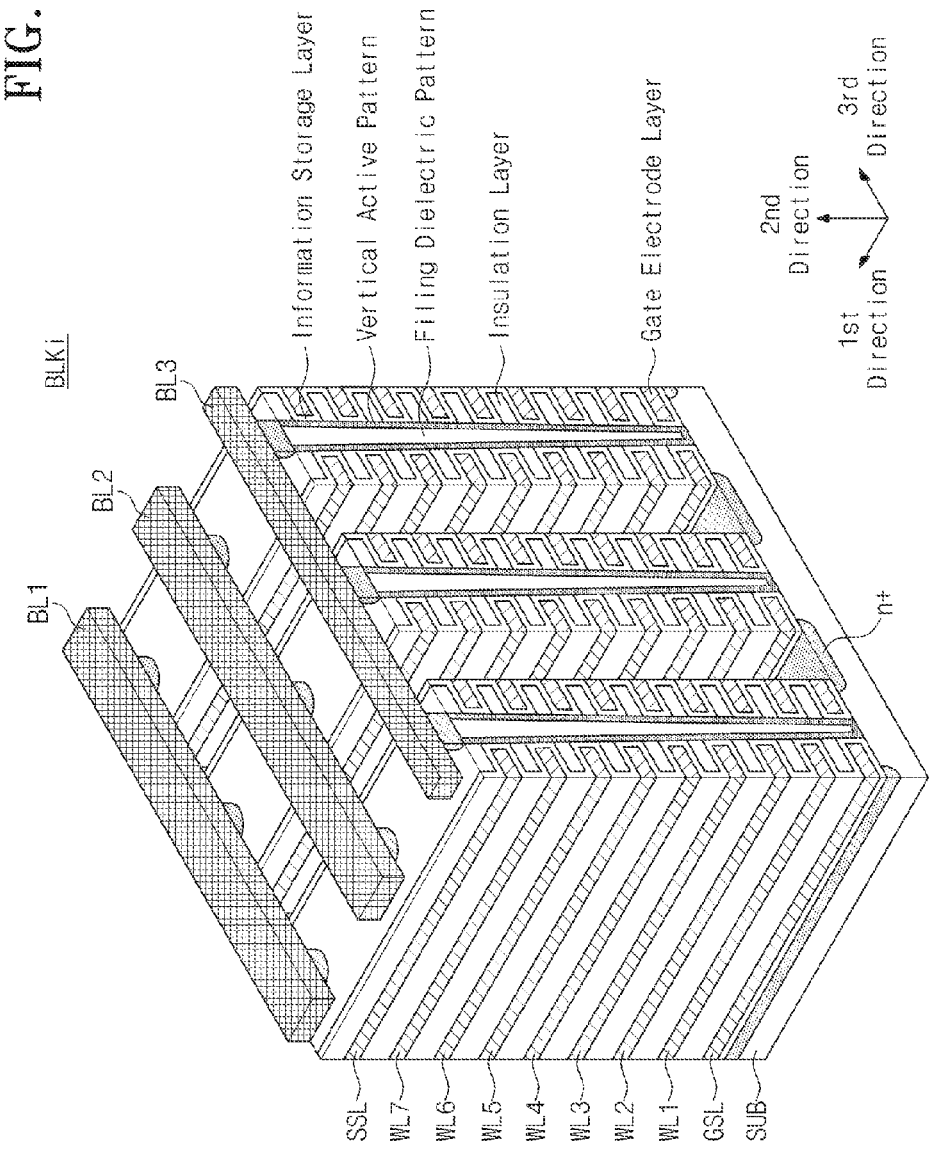
FIG. 4 is a perspective view illustrating a structure corresponding to the memory block BLKi of FIG. 3 according to example embodiments.

FIG. 4 is a perspective view illustrating a structure corresponding to the memory block BLKi of FIG. 3 according to example embodiments. Referring to FIG. 4, the memory block BLKi may be formed in a direction perpendicular to a substrate SUB. An n+ doping region may be formed in the substrate SUB.

A plurality of gate electrode layers and a plurality of insulating layers may be alternately stacked on top of each other on the substrate SUB. An information storage layer may be formed to extend vertically through the gate electrode layers and the insulating layers alternately stacked. The gate electrode layer and the insulating layer may be vertically patterned to form a pillar of a tapered shape (e.g., V shape). The pillar may penetrate the gate electrode layers and the insulating layers to be connected to the substrate SUB. The inside of the pillar may include a filling dielectric pattern and may be constituted by an insulating material such as silicon oxide. The outside of the pillar may be a vertical active pattern and may include channel semiconductor.

The plurality of gate electrode layers of the memory block BLKi may be connected to a ground select line GSL, a plurality of word lines WL1~WL7, and a string select line SSL. The pillar of the memory block BLKi may be connected to a plurality of bit lines BL1~BL3. In FIG. 4, an example is illustrated that the memory block BLKi is connected to two select lines SSL and GSL, seven word lines WL1~WL7 and three bit lines BL1~BL3 but inventive concepts are not limited thereto.

Figure 5:
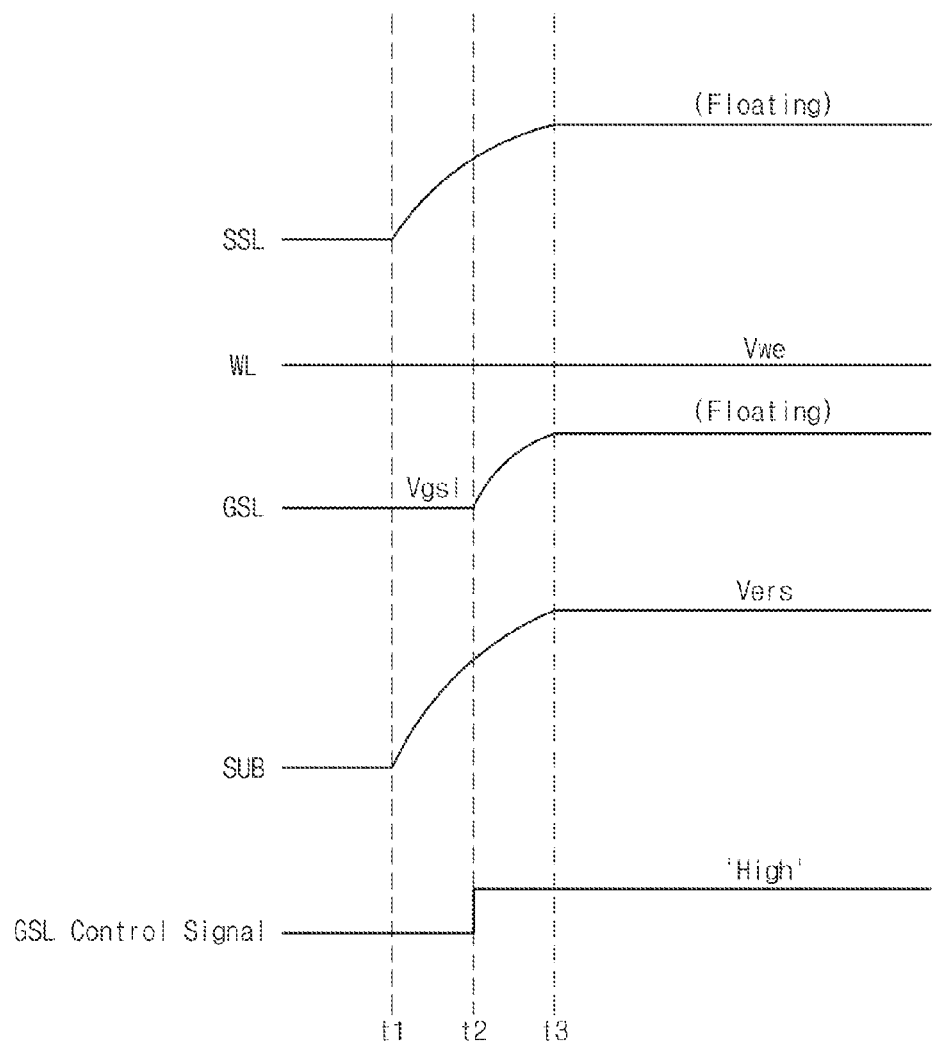
FIG. 5 is a timing diagram illustrating a voltage change of the memory block BLKi of FIG. 4 in an erase operation.

FIG. 5 is a timing diagram illustrating a voltage change of the memory block BLKi of FIG. 4 in an erase operation. Referring to FIGS. 1 through 5, the ground select line GSL may be floated after a desired (and/or alternatively predetermined) time passes from a first time (t1) when an erase voltage Vers begins to be applied to the substrate SUB. This is to smoothly supply an erase voltage Vers to a channel in an erase operation. For example, when an erase voltage Vers is supplied to the substrate SUB, the erase voltage Vers is supplied to the channel by holes. If the ground select line GSL is floated at the first time (t1) and its voltage increases due to a coupling with the substrate SUB, an erase voltage Vers may not be easily supplied to the channel. Thus, to easily supply an erase voltage Vers by a hole, the ground select line GSL may be floated after a desired (and/or alternatively predetermined) time passes from the first time (t1).

At the first time (t1), an erase voltage Vers begins to be applied to the substrate SUB. The address decoder 120 may deliver the erase voltage Vers to the substrate of the memory cell array 110.

The erase voltage Vers may be a high voltage. At the first time (t1) when the erase voltage Vers begins to be applied, a ground select line voltage Vgsl is applied to the ground select line GSL. The ground select line voltage Vgsl may be applied to the ground select line GSL until a second time (t2). At the first time (t1) when the erase voltage Vers begins to be applied, a word line erase voltage Vwe is applied to the word lines WL. The word line erase voltage Vwe may be generated using the voltage generator 130 and applied to the word lines WL using the address Decoder 120. The ground select line voltage Vgsl may be generated using the voltage generator 130 and may be applied to the word lines WL using the address Decoder 120.

The ground select line voltage Vgsl and the word line erase voltage Vwe may be low voltages. For example, the ground select line voltage Vgsl and the word line erase voltage Vwe may be a ground voltage (0V). A difference between the ground select line voltage Vgsl and the erase voltage Vers and between the word line erase voltage Vwe and the erase voltage Vers may be maintained between the first time (t1) and the second time (t2). Thus, an increasing erase voltage Vers may be stably supplied to the vertical active pattern corresponding to the memory cells MC1~MC7.

The string select line SSL is floated from the first time (t1) when an erase voltage Vers begins to be applied. A voltage of the string select line SSL may increase by a coupling effect. The string select transistor SST may be erase-prohibited.

At the second time (t2), a level of a GSL control signal may be changed from low to high. Thus, at the second time (t2), the ground select line GSL may be floated according to the GSL control signal. A voltage of the ground select line GSL may increase by a coupling effect. A Fowler-Nordheim tunneling may not occur in the ground select transistor GST. The ground select transistor GST may be erase-prohibited.

After the second time (t2), a difference between the erase voltage Vers and the word line erase voltage Vwe may cause a Fowler-Nordheim tunneling in the memory cells MC. Thus, data of the memory cells MC may be erased.

Figure 6:
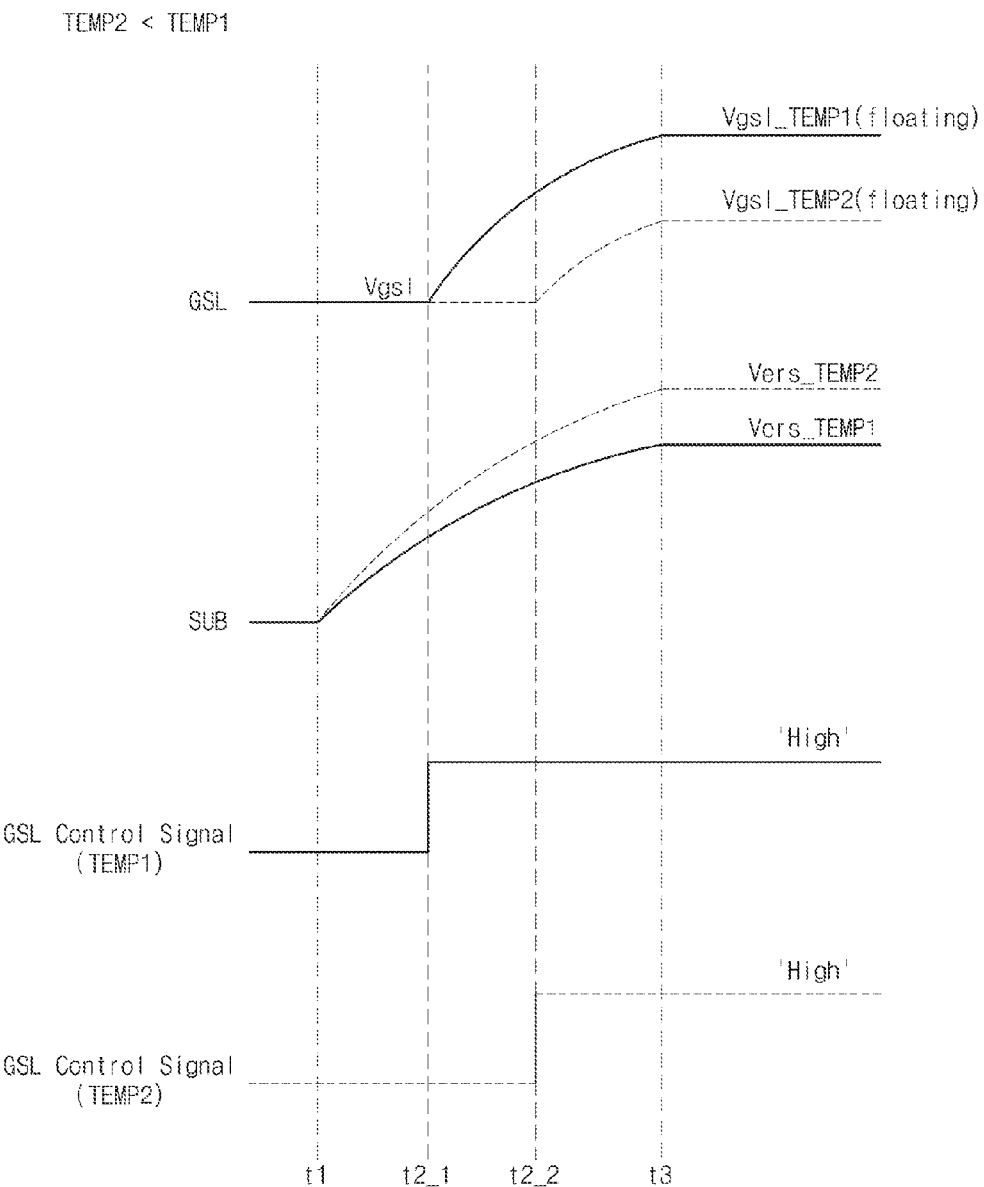
FIG. 6 is a timing diagram illustrating a voltage change of a substrate SUB and a ground select line GSL in an erase operation in accordance with example embodiments of inventive concepts.

FIG. 6 is a timing diagram illustrating a voltage change of a substrate SUB and a ground select line GSL in an erase operation in accordance with example embodiments of inventive concepts. Referring to FIGS. 1 and 6, different erase voltages Vers may be applied according to a temperature of the substrate SUB. It is assumed that a first temperature TEMP1 is greater than a second temperature TEMP2.

At a first time (t1), an erase voltage Vers begins to be applied to the substrate SUB. For example, when a temperature is the first temperature TEMP1, a first erase voltage Vers_TEMP1 may be applied to the substrate SUB. When a temperature is the second temperature TEMP2, a second erase voltage Vers_TEMP2 may be applied to the substrate SUB. That is, at a low temperature, a higher erase voltage Vers may be applied. The voltage generating circuit 131 can generate different erase voltages depending on a temperature using first temperature information TMIF1.

At the first time (t1), a ground select line voltage Vgsl may be applied to the ground select line GSL. The ground select line voltage Vgsl may be maintained for a desired (and/or alternatively predetermined) time. For example, when a temperature is the first temperature TEMP1, the ground select line GSL may be maintained at the ground select line voltage Vgsl until a second_1 time (t2_1). When a temperature is the second temperature TEMP2, the ground select line GSL may be maintained at the ground select line voltage Vgsl until a second_2 time (t2_2). The ground select line voltage Vgsl may be a ground voltage (0V). The second_2 time (t2_2) may be greater than the second_1 time (t2_1).

The GSL transition determining circuit 132 can generate GSL transition information using second temperature information TMIF2. The control logic 150 can generate a GSL control signal according to the GSL transition information. The GSL control signal may transit at different times depending on a temperature. For example, when a temperature is the first temperature TEMP1, the GSL control signal may transit to a high level at the second_1 time (t2_1). When a temperature is the second temperature TEMP2, the GSL control signal may transit to a high level at the second_2 time (t2_2).

The address decoder 120 can float the ground select line GSL according to the GSL control signal. For example, when a temperature is the first temperature TEMP1, the ground select line GSL may be floated at the second_1 time (t2_1). When a temperature is the second temperature TEMP2, the ground select line GSL may be floated at the second_2 time (t2_2).

In an erase operation, a floating time of the ground select line GSL may be differently controlled depending on a temperature. A range and linearity of a floating time of the ground select line GSL may be improved in an erase operation by applying an offset with respect to a temperature twice.

Figure 7:
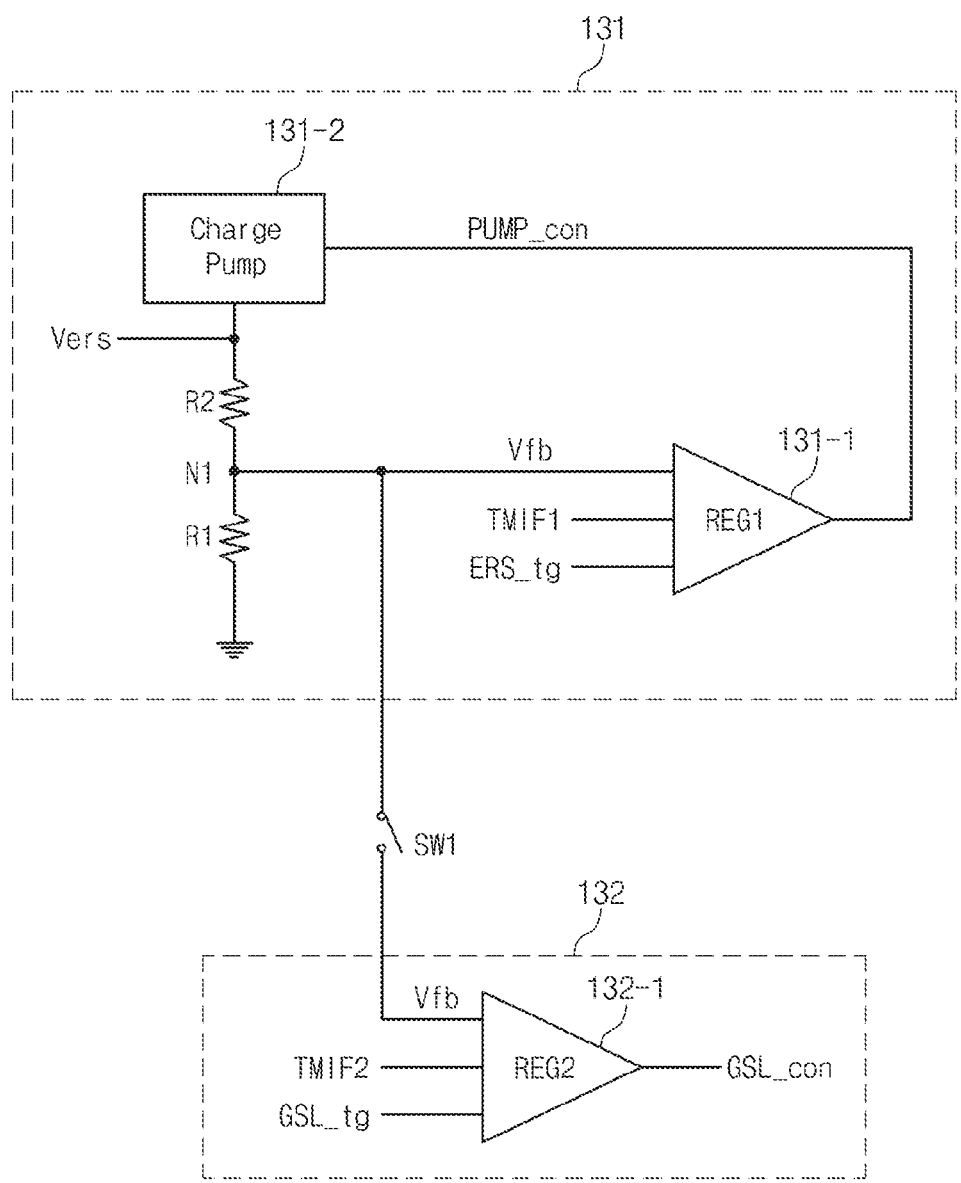
FIG. 7 is a circuit diagram illustrating a voltage generating circuit and a GSL transition determining circuit of FIG. 1 in accordance with example embodiments of inventive concepts.

FIG. 7 is a circuit diagram illustrating a voltage generating circuit and a GSL transition determining circuit of FIG. 1 in accordance with example embodiments of inventive concepts. Referring to FIG. 7, the voltage generating circuit 131 may include a first regulator 131-1 and a charge pump 131-2. For example, the voltage generating circuit 131 can generate an erase voltage Vers being supplied to a substrate in an erase operation. The voltage generating circuit 131 can generate voltages used when performing other operations (e.g., a program or read operation). The GSL transition determining circuit 132 may include a second regulator 132-1. The voltage generating circuit 131 and the GSL transition determining circuit 132 may be connected to each other through a first switch SW1. The first switch SW1 may be turned on in an erase operation. The first switch SW1 may be turned off in a program or read operation. Thus, the GSL transition determining circuit 132 may be connected to the voltage generating circuit 131 only in an erase operation.

According to a control of the control logic 150 in an erase operation, the voltage generating circuit 131 can generate an erase voltage Vers. For example, the first regulator 131-1 can receive an erase target voltage ERS_tg, a feedback voltage Vfb and first temperature information TMIF1. The first temperature information TMIF1 can compensate the erase target voltage ERS_tg on the basis of the first temperature information TMIF1. For example, the first regulator 131-1 may increase or decrease the erase target voltage ERS_tg according to the first temperature information TMIF1. The first regulator 131-1 may compensate the erase target voltage ERS_tg so that the erase target voltage ERS_tg increases if the second temperature TEMP2 is less than the first temperature TEMP1. The first regulator 131-1 may compare the feedback voltage Vfb with the compensated erase target voltage ERS_tg to generate a pump control signal PUMP_con. For example, the feedback voltage Vfb corresponds to a voltage obtained by dividing the erase voltage Vers by first and second resistors R1 and R2. The first regulator 131-1 may be configured to generate the pump control signal PUMP_con at a first level if the feedback voltage Vfb is smaller than the compensated erase target voltage ERS_tg. The first regulator 131-1 may be configured to generate the pump control signal PUMP_con at a second level if the feedback voltage Vfb is equal to the compensated erase target voltage ERS_tg. The first regulator 131-1 may be configured to generate the pump control signal PUMP_con at a third level if the feedback voltage Vfb is greater than the compensated erase target voltage ERS_tg. The first level is greater than the second level, and the second level is greater than the third level.

The charge pump 131-2 can control the erase voltage Vers according to the pump control signal PUMP_con. For example, in the case that the feedback voltage Vfb is smaller than the compensated erase target voltage ERS_tg, the erase voltage Vers may increase. In the case that the feedback voltage Vfb is equal to the compensated erase target voltage ERS_tg, the erase voltage Vers may be maintained at a constant value. In the case that the feedback voltage Vfb is greater than the compensated erase target voltage ERS_tg, the erase voltage Vers may decrease.

In an erase operation, the second regulator 132-2 can receive a GSL target voltage GSL_tg, the feedback voltage Vfb and second temperature information TMIF2. The second regulator 132-1 can compensate the GSL target voltage GSL_tg based on the second temperature information TMIF2. For example, the second regulator 131-2 may increase or decrease the GSL target voltage GSL_tg according to the second temperature information TMIF2. The second regulator 132-1 may compensate the GSL target voltage GSL_tg so that the GSL target voltage GSL_tg increases in the case of the second temperature TEMP2 being greater than the first temperature TEMP1. The second regulator 132-1 may compare the feedback voltage Vfb with the compensated GSL target voltage GSL_tg to generate GSL transition information GSL_con. For example, in the case that the feedback voltage Vfb is smaller than the compensated GSL target voltage GSL_tg, the GSL transition information GSL_con may have a low level. In the case that the feedback voltage Vfb is equal to or greater than the compensated GSL target voltage GSL_tg, the GSL transition information GSL_con may have a high level.

The control logic 150 can generate a GSL control signal based on the GSL transition information GSL_con. For example, if the GSL transition information GSL_con is changed from a low level to a high level, the GSL control signal may be changed from a low level to a high level. If the GSL transition information GSL_con is changed from a high level to a low level, the GSL control signal may be changed from a high level to a low level. The address decoder 120 can float the ground select line GSL according to the GSL control signal.

The nonvolatile memory device 100 can control a floating time of the ground select line GSL according to a temperature in an erase operation. A range and linearity of a floating time of a ground select line GSL may be improved in an erase operation by applying an offset with respect to a temperature twice.

Figure 8:
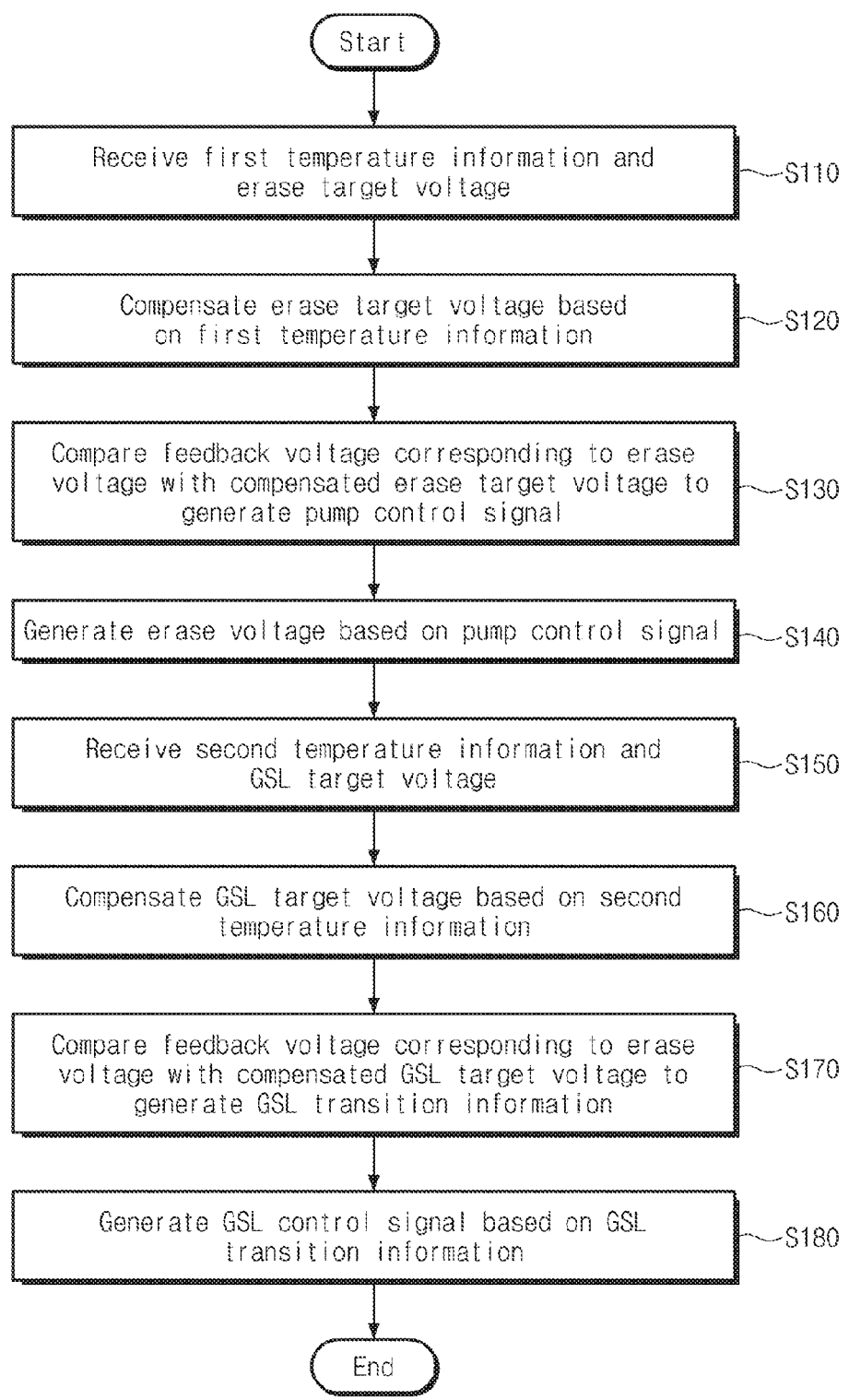
FIG. 8 is a flowchart illustrating a GSL transition method in an erase operation in accordance with example embodiments of inventive concepts.

FIG. 8 is a flowchart illustrating a GSL transition method in an erase operation in accordance with example embodiments of inventive concepts. A physical characteristic of the nonvolatile memory device 100 may be different depending on a temperature. Thus, a floating time of the ground select line GSL may be changed according to a temperature. Referring to FIGS. 1, 7 and 8, the nonvolatile memory device 100 can change a floating time of the ground select line GSL according to a temperature.

In a step S110, the voltage generating circuit 131 may receive the first temperature information TMIF1 and the erase target voltage ERS_tg. For example, the first temperature information TMIF1 may be offset values for compensating the erase target voltage ERS_tg according to a temperature.

In a step S120, the voltage generating circuit 131 can compensate the erase target voltage ERS_tg based on the first temperature information TMIF1. For example, the first regulator 131-1 may receive the erase target voltage ERS_tg, the feedback voltage Vfb and the first temperature information TMIF1. The first regulator 131-1 can compensate the erase target voltage ERS_tg based on the first temperature information TMIF1. For example, the first regulator 131-1 may increase or decrease the erase target voltage ERS_tg according to the first temperature information TMIF1. The first regulator 131-1 may compensate the erase target voltage ERS_tg so that the erase target voltage ERS_tg increases in the case of the second temperature TEMP2 being less than the first temperature TEMP1.

In a step S130, the voltage generating circuit 131 may compare the feedback voltage Vfb corresponding to the erase voltage Vers with the compensated erase target voltage ERS_tg to generate the pump control signal PUMP_con. For example, the first regulator 131-1 may compare the feedback voltage Vfb with the compensated erase target voltage ERS_tg to generate the pump control signal PUMP_con. The feedback voltage Vfb corresponds to a voltage obtained by dividing the erase voltage Vers by first and second resistors R1 and R2.

In a step S140, the voltage generating circuit 131 can generate the erase voltage Vers based on the pump control signal PUMP_con. For example, the charge pump 131-2 can control the erase voltage Vers according to the pump control signal PUMP_con. In the case that the feedback voltage Vfb is smaller than the compensated erase target voltage ERS_tg, the erase voltage Vers may increase. In the case that the feedback voltage Vfb is equal to or greater than the compensated erase target voltage ERS_tg, the erase voltage Vers may be maintained at a constant value.

In a step S150, the GSL transition determining circuit 132 may receive the second temperature information TMIF2 and the GSL target voltage GSL_tg. For example, the second temperature information TMIF2 may be offset values for compensating the GSL target voltage ERS_tg according to a temperature.

In a step S160, the GSL transition determining circuit 132 can compensate the GSL target voltage GSL_tg based on the second temperature information TMIF2. For example, the second regulator 132-1 can compensate the GSL target voltage GSL_tg based on the second temperature information TMIF2. The second regulator 132-1 may increase or decrease the GSL target voltage GSL_tg according to the second temperature information TMIF2. The second regulator 132-1 may compensate the GSL target voltage GSL_tg so that the GSL target voltage GSL_tg increases in the case of the second temperature TEMP2 being greater than the first temperature TEMP1.

In a step S170, the GSL transition determining circuit 132 can compare the feedback voltage Vfb corresponding to the erase voltage Vers with the compensated GSL target voltage GSL_tg to generate the GSL transition information GSL_con. For example, the second regulator 132-1 can compare the feedback voltage Vfb with the compensated GSL target voltage GSL_tg to generate the GSL transition information GSL_con. In the case that the feedback voltage Vfb is smaller than the compensated GSL target voltage GSL_tg, the GSL transition information GSL_con may have a low level. In the case that the feedback voltage Vfb is equal to or greater than the compensated GSL target voltage GSL_tg, the GSL transition information GSL_con may have a high level.

In a step S180, the control logic 150 can generate a GSL control signal based on the GSL transition information GSL_con. The GSL transition information GSL_con can notify a time when the ground select line GSL is floated. For example, if the GSL transition information GSL_con is changed from a low level to a high level, the GSL control signal may be changed from a low level to a high level. If the GSL transition information GSL_con is changed from a high level to a low level, the GSL control signal may be changed from a high level to a low level. The address decoder 120 can float the ground select line GSL at a time when the GSL control signal increases to a high level.

The nonvolatile memory device 100 can control a floating time of the ground select line GSL according to a temperature in an erase operation. A range and linearity of a floating time of a ground select line GSL may be improved in an erase operation by applying an offset with respect to a temperature twice.

Figure 9:
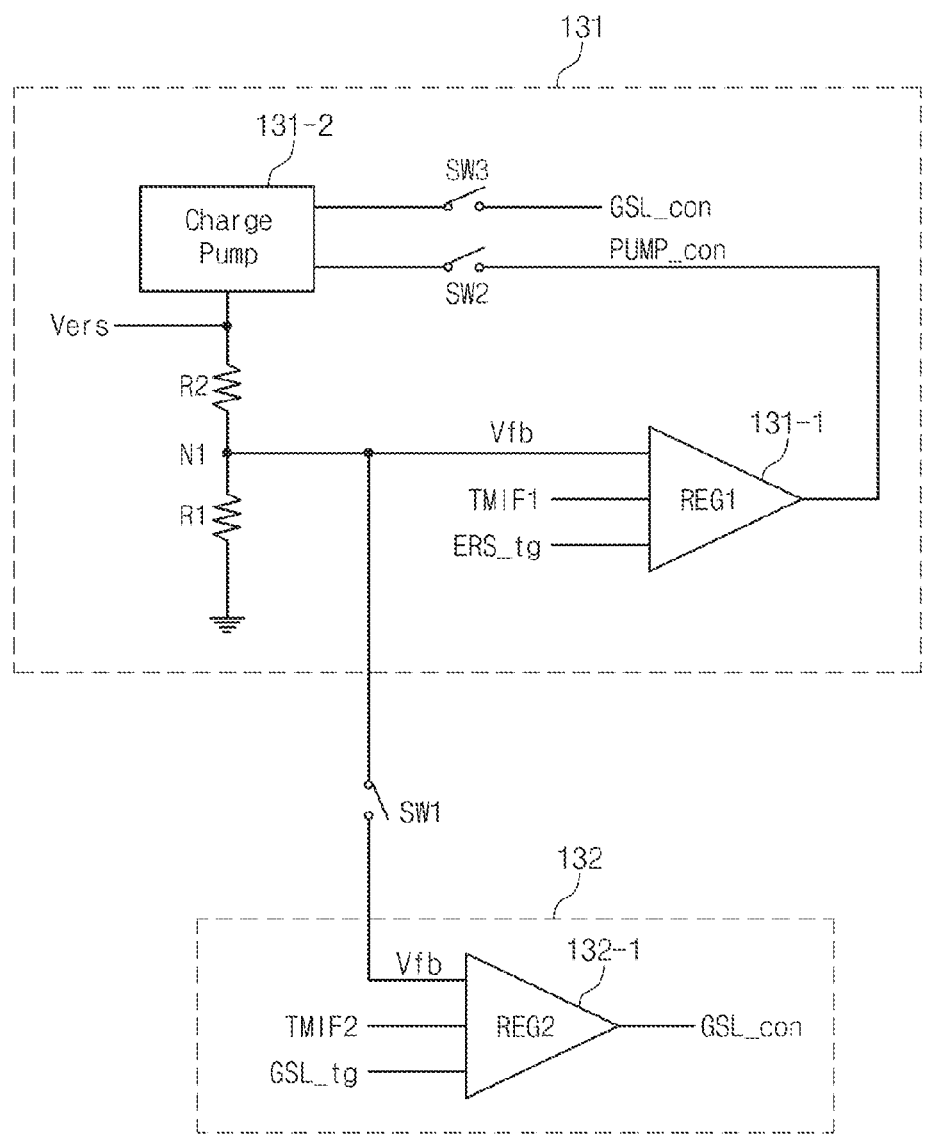
FIG. 9 is a circuit diagram illustrating a substrate voltage generator circuit and a GSL transition determining circuit of FIG. 1 in accordance with example embodiments of inventive concepts.

FIG. 9 is a circuit diagram illustrating a substrate voltage generator circuit and a GSL transition determining circuit of FIG. 1 in accordance with example embodiments of inventive concepts. FIG. 10 is a drawing illustrating states of switches SW1-SW3 of FIG. 9 according to an operation mode. Referring to FIGS. 9 and 10, a voltage generating circuit 131 and a GSL transition circuit 132 may operate in an erase mode or in a trim mode.

In an erase mode, first and second switches SW1 and SW2 may be turned on and a third switch SW3 may be turned off. At this time, the voltage generating circuit 131 and the GSL transition circuit 132 may a normal erase operation.

In a trim mode, the first and third switches SW1 and SW3 may be turned on and the second switch SW2 may be turned off. At this time, a charge pump 131-2 may receive GSL transition information GSL_con instead of a pump control signal PUMP_con. Thus, the charge pump 131-2 can output an erase voltage Vers corresponding to a GSL target voltage GSL_tg. The nonvolatile memory device 100 can check a level of the erase voltage Vers corresponding to the GSL target voltage GSL_tg to judge the suitability of the GSL target voltage GSL_tg.

Figure 11:
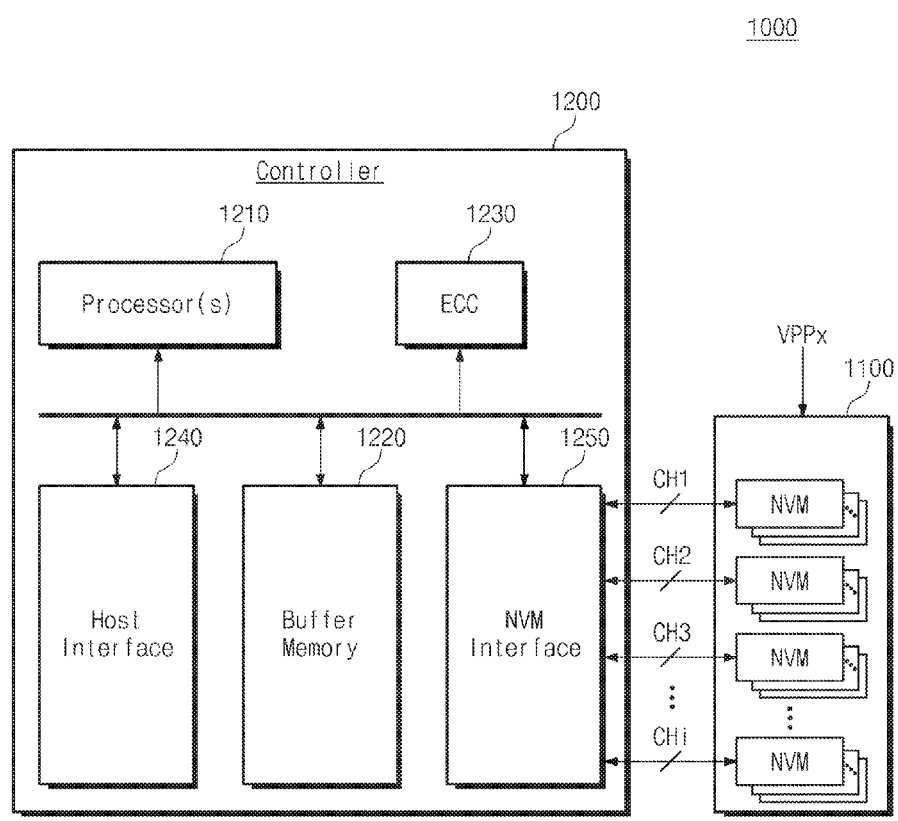
FIG. 11 is a block diagram illustrating a SSD in accordance with example embodiments of inventive concepts.

FIG. 11 is a block diagram illustrating a SSD in accordance with example embodiments of inventive concepts. Referring to FIG. 11, a SSD 1000 may include a plurality of nonvolatile memory devices 1100 and a SSD controller 1200.

The nonvolatile memory devices 1100 may be configured to selectively receive an external high voltage VPPx. Each of the nonvolatile memory devices 1100 can control a floating time of a ground select line GSL according to a temperature as described in FIGS. 1 through 10. A range and linearity of a floating time of a ground select line GSL may be improved in an erase operation by applying an offset with respect to a temperature twice.

The SSD controller 1200 may be connected to the nonvolatile memory devices 1100 through a plurality of channels CH1~Chi. The SSD controller 1200 may include at least one processor 1210, a buffer memory 1220, an error correction circuit 1230, a host interface 1240 and a nonvolatile memory interface 1250.

The buffer memory 1220 may temporarily store data used to drive the SSD controller 1200. The buffer memory 1220 may include a plurality of memory lines storing data or commands.

The error correction circuit 1230 can calculate an error correction code value of data to be programmed in a write operation, correct data read in a read operation on the basis of the error correction code value, and correct an error of data restored from the nonvolatile memory device 1100 in a data restore operation. Although not illustrated, a code memory storing code data used to drive the SSD controller 1200 may be further included. The code memory may be embodied by a nonvolatile memory device.

The host interface 1240 may provide an interface function with an external device. The host interface 1240 may be a NAND interface. The nonvolatile memory interface 1250 may provide an interface function with the nonvolatile memory device 1100.

Figure 12:
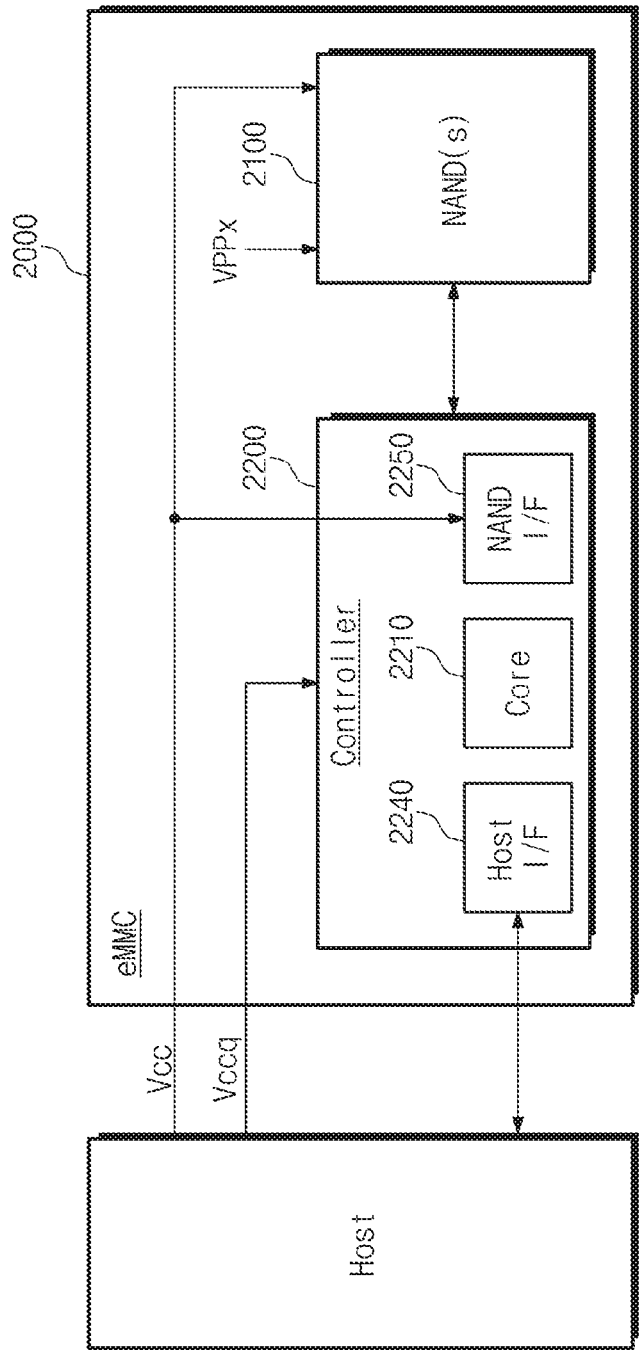
FIG. 12 is a block diagram illustrating an eMMC in accordance with example embodiments of inventive concepts.

FIG. 12 is a block diagram illustrating an eMMC in accordance with example embodiments of inventive concepts. Referring to FIG. 12, an eMMC 2000 may include at least one NAND flash memory device 2100 and a controller 2200.

The NAND flash memory device 2100 may be a single data rate (SDR) or a double data rate (DDR). The NAND flash memory device 2100 can control a floating time of a ground select line GSL according to a temperature as described in FIGS. 1 through 10. A range and linearity of a floating time of a ground select line GSL may be improved in an erase operation by applying an offset with respect to a temperature twice.

The controller 2200 may be connected to the NAND flash memory device 2100 through a plurality of channels. The controller 2200 may include at least one controller core 2210, a host interface 2240, and a NAND interface 2250. The controller core 2210 can control an overall operation of the eMMC 2000. The host interface 2240 can perform an interface between the controller 2200 and a host. The NAND interface 2250 performs an interface between the controller 2200 and the NAND flash memory device 2100. The host interface 2240 may be a parallel interface (e.g., MMC interface). In example embodiments, the host interface 2240 may be a serial interface (e.g., UHS-II, UFS interface).

The eMMC 2000 may receive power supply voltages Vcc and Vccq from the host. A first power supply voltage Vcc (e.g., 3.3V) may be provided to the NAND flash memory device 2100 and the NAND interface 2250, and a second power supply voltage Vccq (e.g., 1.8V/3.3V) may be provided to the controller 2200. The eMMC 2000 may selectively receive an external high voltage VPPx.

Figure 13:
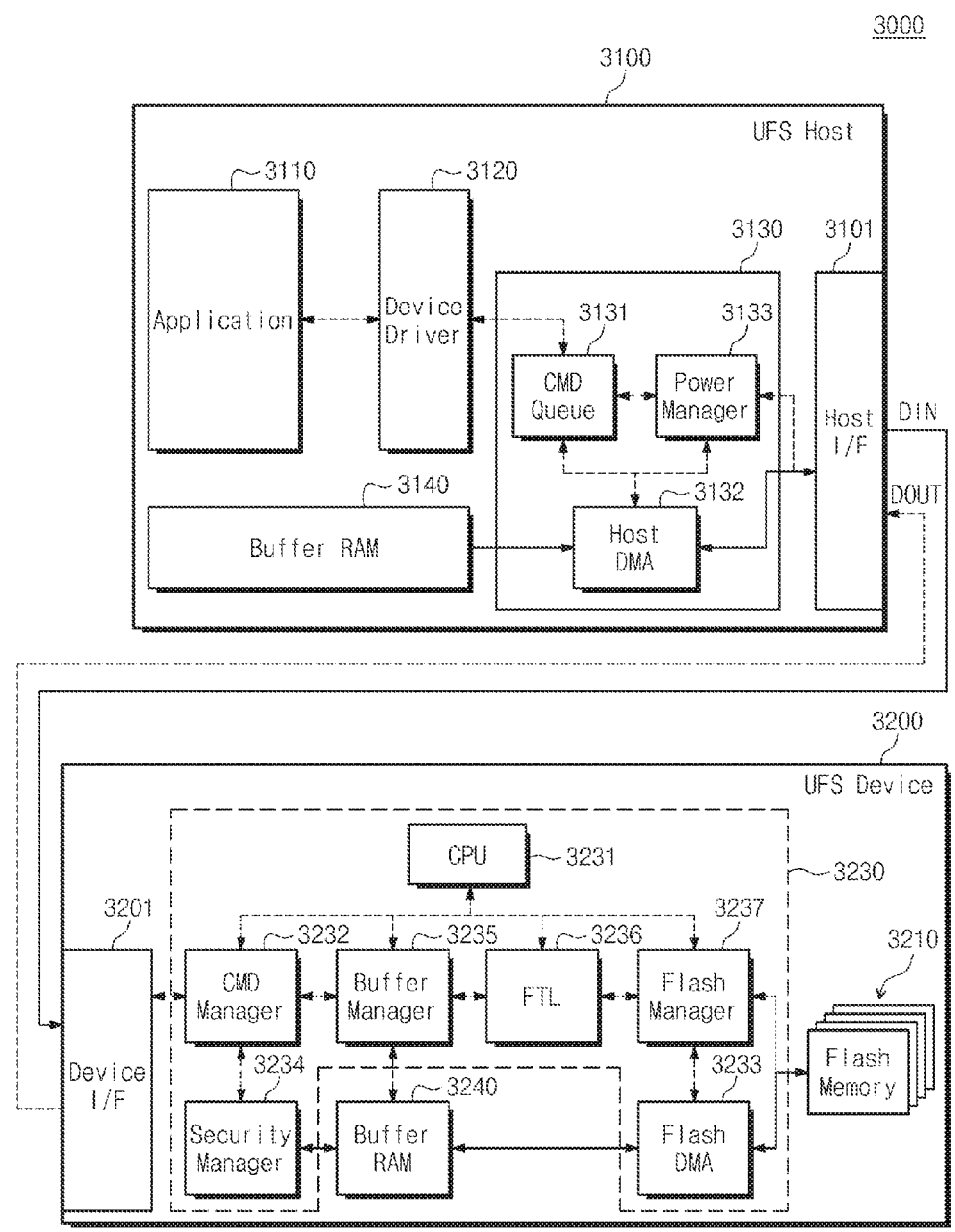
FIG. 13 is a block diagram illustrating a UFS system in accordance with example embodiments of inventive concepts.

Inventive concepts may be applicable to a UFS (universal flash storage) system. FIG. 13 is a block diagram illustrating a UFS system in accordance with example embodiments of inventive concepts. Referring to FIG. 13, a UFS system 3000 may include a UFS host 3100 and a UFS device 3200.

The UFS host 3100 may include an application 3110, a device driver 3120, a host controller 3130, and a buffer RAM 3140. The host controller 3130 may include a command queue 3131, a host DMA 3132, and a power manager 3133. The command queue 3131, the host DMA 3132, and the power manager 3133 may operate in algorithm, software, or firmware in the host controller 3130.

A command (e.g., a write command) generated in the application 3110 and the device driver 3120 of the UFS host 3100 may be input into the command queue 3131 of the host controller 3130. The command queue 3131 can sequentially store commands to be provided to the UFS device 3200. Command stored in the command queue 3131 may be provided to the host DMA 3132. The host DMA 3132 sends commands to the UFS device 3200 through a host interface 3101.

The UFS device 3200 may include at least one flash memory 3210, a device controller 3230, and a buffer RAM 3240. The device controller 3230 may include a central processing unit (CPU) 3231, a command manager 3232, a flash DMA 3233, a security manager 3234, a buffer manager 3235, a flash translation layer (FTL) 3236, and a flash manager 3237. The command manager 3232, the security manager 3234, the buffer manager 3235, the flash translation layer (FTL) 3236, and the flash manager 3237 may operate in algorithm, software, or firmware in the device controller 3230.

The flash memory 3210 can control a floating time of a ground select line GSL according to a temperature as described in FIGS. 1 through 10. A range and linearity of a floating time of a ground select line GSL may be improved in an erase operation by applying an offset with respect to a temperature twice.

A command input into the UFS device 3200 from the UFS host 3100 may be provided to the command manager 3232 through the device interface 3201. The command manager 3232 can interpret a command provided from the UFS host 3100 and can certify an inputted command using the security manager 3234. The command manager 3232 can allocate the buffer RAM 3240 to receive data through the buffer manager 3235. If a data transfer preparation is completed, the command manager 3232 transfers RTT (READY_TO-TRANSFER) UPIU to the UFS host 3100.

The UFS host 3100 can transfer data to the UFS device 3200 in response to the RTT (READY_TO-TRANSFER) UPIU. Data can be transferred to the UFS device 3200 through the host DMA 3132 and the host interface 3101. The UFS device 3200 can store provided data in the buffer RAM 3240 through the buffer manager 3235. Data stored in the buffer RAM 3240 may be provided to the flash manager 3237 through the flash DMA 3233. The flash manager 3237 can store data in a selected address of the flash memory 3210 with reference to address mapping information of the flash translation layer 3236.

If a data transmission and a data program that are necessary for a command is completed, the UFS device 3200 transmits a response signal to the UFS host 3100 through an interface and notifies a command completion. The UFS host 3100 can notify the device driver 3120 and the application 3110 of whether the command is completed and can finish an operation with respect to the corresponding command.

Figure 14:
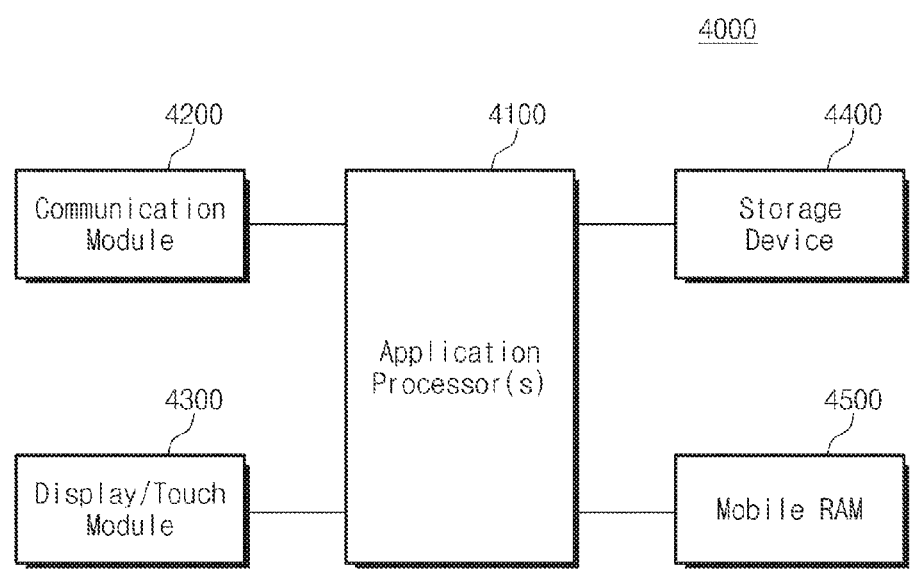
FIG. 14 is a block diagram illustrating a mobile device in accordance with example embodiments of inventive concepts.

Inventive concepts may be applicable to a mobile device. FIG. 14 is a block diagram illustrating a mobile device in accordance with example embodiments of inventive concepts. Referring to FIG. 14, a mobile device 4000 may include an application processor 4100, a communication module 4200, a display/touch module 4300, a storage device 4400 and a mobile RAM 4500.

The application processor 4100 can control an overall operation of the mobile device 4000. The communication module 4200 may be embodied to control a wire/wireless communication with the outside. The display/touch module 4300 may be embodied to display data processed by the application processor 4100 or receive data from a touch panel. The storage device 4400 may be embodied to store data of a user. The storage device 4400 may be an eMCC, a SSD or a UFS device. The mobile RAM 4500 may be embodied to temporarily store data used in a processing operation of the mobile device 4000.

The storage device 4400 can control a floating time of a ground select line GSL according to a temperature as described in FIGS. 1 through 10. A range and linearity of a floating time of a ground select line GSL may be improved in an erase operation by applying an offset with respect to a temperature twice.

A memory system or a storage device in accordance with example embodiments of inventive concepts may be mounted using various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP) and wafer-level processed stack package (WSP).

Example embodiments of inventive concepts relate to a nonvolatile memory device for improving a threshold voltage distribution of an erase state by controlling a floating time of a ground select line according to a temperature in an erase operation and a method of erasing the nonvolatile memory device.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A nonvolatile memory device comprising:
    a memory cell array including at least one bit line and a plurality of cell strings on a substrate, each of the cell strings including a plurality of memory cells stacked on each other in a direction perpendicular to the substrate, a ground select transistor between the memory cells and the substrate, and a string select transistor on the memory cells between the memory cells and one of the at least one bit line;
    an address decoder configured to provide an erase voltage to the substrate during an erase operation, the address decoder being configured to float a ground select line connected to the ground select transistor in at least one of the cell strings after a specific time passes after the address decoder provides the erase voltage to the substrate during the erase operation;
    a voltage generator configured generate the erase voltage, the voltage generator being configured to change the erase voltage based on a temperature using first temperature information and ground select line transition information based on a feedback voltage corresponding to the erase voltage and second temperature information; and
    a control logic configured to generate a ground select line control signal based on the ground select line transition information,
    the address decoder being configured to float the ground select line according to the ground select line control signal.

2. The nonvolatile memory device of claim 1, wherein the voltage generator is configured to generate the erase voltage so that the erase voltage increases or decreases by an offset voltage according to the first temperature information.

3. The nonvolatile memory device of claim 1, wherein the voltage generator is configured to generate a first level of the erase voltage at a first temperature and to generate a second level of the erase voltage at a second temperature, and the second level of the erase voltage is higher than the first level of the erase voltage if the first temperature is higher than the second temperature.

4. The nonvolatile memory device of claim 3, wherein the control logic is configured to generate the ground select line control signal so that the address decoder floats the ground select line at a later time at the second temperature rather than at the first temperature.

5. The nonvolatile memory device of claim 1, wherein the voltage generator is configured to generate the feedback voltage corresponding to the erase voltage according to a voltage division of a plurality of resistors.

6. The nonvolatile memory device of claim 1, wherein the voltage generator includes:
    a voltage generating circuit configured to generate the erase voltage and the feedback voltage; and
    a ground select line transition determining circuit configured to generate the ground select line transition information.

7. The nonvolatile memory device of claim 6, wherein the voltage generating circuit includes a regulator configured to receive an erase target voltage,
    the voltage generating circuit is configured to compensate the erase target voltage according to the first temperature information, and
    the regulator is configured to generate a pump control signal based on comparing the compensated erase target voltage with the feedback voltage.

8. The nonvolatile memory device of claim 7, wherein the regulator is configured to generate the pump control signal at a first level if the feedback voltage is smaller than the compensated erase target voltage,
    the regulator is configured to generate the pump control signal at a second level if the feedback voltage is equal to the compensated erase target voltage, and
    the regulator is configured to generate the pump control signal at a third level if the feedback voltage is greater than the compensated erase target voltage,
    wherein the first level is greater than the second level, and the second level is greater than the third level.

9. The nonvolatile memory device of claim 7, wherein the voltage generating circuit includes a charge pump configured to generate the erase voltage according to the pump control signal.

10. The nonvolatile memory device of claim 6, wherein the ground select line transition determining circuit includes a regulator configured to receive a ground select line target voltage,
    the regulator is configured to compensate the ground select line target voltage according to the second temperature information, and
    the regulator is configured to generate the ground select line transition information based on comparing the compensated ground select line target voltage with the feedback voltage.

11. The nonvolatile memory device of claim 10, wherein the regulator is configured to generate the ground select line transition information at a first level if the feedback voltage is smaller than the compensated ground select line target voltage,
    the regulator is configured to generate the ground select line transition information at a second level if the feedback voltage is equal to the compensated ground select line target voltage, and the regulator is configured to generate the ground select
line transition information at a third level if the feedback voltage is greater than the compensated ground
select line target voltage,
wherein the first level is greater than the second level, and
the second level is greater than the third level.

12. A nonvolatile memory device comprising:
word lines connected to a plurality of memory cells
stacked in a direction perpendicular to a substrate;
a ground select line connected to a ground select transistor
provided between the memory cells and the substrate;
and
a string select line connected to a string select transistor
provided between the memory cells and a bit line,
wherein in an erase operation, the ground select line is
floated at a time when a specific time passes after the
erase voltage is provided to the substrate, and
wherein the ground select line is floated at different times
depending on a temperature.

13. The nonvolatile memory device of claim 12, wherein
the erase voltage is controlled to increase or decrease by an
offset voltage according to a temperature based on first
temperature information.

14. The nonvolatile memory device of claim 13, wherein
ground select line transition information is generated based
on a feedback voltage corresponding to the erase voltage
compensated by the first temperature information and second temperature information, and
wherein the ground select line is floated at different times
according to a temperature based on the ground select
line transition information.

15. The nonvolatile memory device of claim 12, wherein
a first temperature is higher than a second temperature and
the erase voltage is generated to have a higher level at the
second temperature rather than at the first temperature, and
wherein the ground select line is floated at a later time at
the second temperature rather than at the first temperature.

16. A nonvolatile memory device comprising:
a memory cell array including a plurality of cell strings on
a substrate, each of the cell strings including a plurality
of memory cells serially connected to each other
between a ground select transistor and a string select
transistor;
a read and write circuit connected to the memory cell
array through at least one bit line;
an address decoder connected to the memory cell array
through a string selection line, word lines, and a ground
selection line,
the address decoder being configured to provide an
erase voltage to the substrate beginning at a first time
during an erase operation,
the address decoder being configured to float the
ground select line beginning at a second time during
the erase operation, the second time being after the
first time; and
a voltage generator connected to the address decoder,
the voltage generator being configured to generate the
erase voltage,
the voltage generator being configured to adjust a time
interval between the first time and the second time
during the erase operation based on temperature
information.

17. The nonvolatile memory device of claim 16, wherein
each of the cell strings is arranged so the string select
transistor is on top of the ground select transistor and so the
memory cells serially-connected to each other are stacked on
top of each other between the ground select transistor and
the string select transistor.

18. The nonvolatile memory device of claim 16, wherein
the voltage generator is configured to generate a first level
of the erase voltage at a first temperature,
the voltage generator is configured to generate a second
level of the erase voltage at a second temperature, and
the second level of the erase voltage is higher than the first
level of the erase voltage if the first temperature is
higher than the second temperature.

19. The nonvolatile memory device of claim 16, wherein
the voltage generator is configured to generate a ground
select line control signal based on the temperature
information,
the address decoder is configured to float the ground
select line according to the ground select line control
signal,
the address decoder is configured to increase or decrease
the time interval between the first time and the second
time during the erase operation according the ground
select line control signal.

20. The nonvolatile memory device of claim 16, further
comprising:
a control logic connected to the voltage generating circuit,
wherein
the voltage generator includes a voltage generating circuit
connected to a ground selection line transition determining circuit,
the voltage generating circuit includes a first regulator, a
charge pump connected to regulator, and two resistors
connected to the charge pump,
the ground selection line transition determining circuit
includes a second regulator,
the first regulator is configured to receive an erase target
voltage, a feedback voltage, and first temperature information,
the first regulator is configured to adjust the erase target
voltage into a compensated erase target voltage by
increasing or decreasing the erase target voltage
according to the first temperature information,
the first regulator is configured to generate a pump control
signal based on comparing the feedback voltage to the
compensated erase target voltage,
the charge pump is configured to control the erase voltage
according to the pump control signal,
the second regulator is configured to receive a ground
select line target voltage, the feedback voltage, and
second temperature information,
the second regulator is configured to compensate the
ground selection line target voltage based on comparing the feedback voltage to the ground selection line
target voltage,
the second regulator is configured to generate ground
selection line transition information from comparing
the feedback voltage with the compensated ground
selection line voltage, and
control logic is configured to generate a ground selection
line control signal based on the ground selection line
transition information, and
the address decoder is configured to float the ground
select line according to the ground selection line control signal.

* * * * *